United States Patent
Mazda

(10) Patent No.: US 7,138,864 B2
(45) Date of Patent: Nov. 21, 2006

(54) OVERCURRENT PROTECTION IN AMPLIFIER TOPOLOGIES EMPLOYING DC ISOLATION

(75) Inventor: Babak Mazda, Los Altos, CA (US)

(73) Assignee: Tripath Technology, Inc., San Jose, CA (US)

( * ) Notice: Subject to any disclaimer, the term of this patent is extended or adjusted under 35 U.S.C. 154(b) by 93 days.

(21) Appl. No.: 10/990,288

(22) Filed: Nov. 15, 2004

(65) Prior Publication Data

US 2005/0122168 A1    Jun. 9, 2005

Related U.S. Application Data

(60) Provisional application No. 60/520,904, filed on Nov. 17, 2003.

(51) Int. Cl.
   *H03F 3/217*    (2006.01)
(52) U.S. Cl. ............... 330/251; 330/207 A; 330/207 P
(58) Field of Classification Search ............... 330/251, 330/207 A, 207 P
   See application file for complete search history.

(56) References Cited

U.S. PATENT DOCUMENTS

| | | | |
|---|---|---|---|
| RE33,333 E | * | 9/1990 | Taylor et al. .............. 330/10 |
| 4,992,751 A | | 2/1991 | Attwood et al. |
| 5,510,753 A | * | 4/1996 | French ..................... 330/146 |
| 5,767,744 A | * | 6/1998 | Irwin et al. ............... 330/297 |
| 5,973,368 A | * | 10/1999 | Pearce et al. ............. 257/368 |
| 6,781,458 B1 | | 8/2004 | Mazda | |

OTHER PUBLICATIONS

Supertex, Inc., "High Voltage Pulser Circuits", VN/VP-13 Series Application Not AN-D8m, May 16, 2001, pp. 1-4.
Acouster, Zetex, "50W Class D Audio Amplifier Evaluation Board", ZXCD50STEVAL, Issue 1, Jul. 2002, pp. 1-12.

* cited by examiner

*Primary Examiner*—Patricia Nguyen
(74) *Attorney, Agent, or Firm*—Beyer Weaver & Thomas LLP

(57) ABSTRACT

An amplifier having output switch circuitry is described. A sense resistor is operable to transmit an output current associated with the output switch circuitry. Low-voltage circuitry is operable to provide a drive signal to the output switch circuitry. Isolation circuitry is operable to provide DC isolation between the low-voltage circuitry and the output switch circuitry. Current sensing circuitry is directly connected to the sense resistor and is operable to sense the output current in the sense resistor and generate a fault signal in response to an overcurrent condition. The fault signal is characterized by a signal level which is compatible with the low-voltage circuitry without additional DC isolation.

15 Claims, 2 Drawing Sheets

OVERCURRENT PROTECTION IN AMPLIFIER TOPOLOGIES EMPLOYING DC ISOLATION

RELATED APPLICATION DATA

The present application claims priority under 35 U.S.C. 119(e) to U.S. Provisional Patent Application No. 60/520,904 for OVERCURRENT PROTECTION IN AMPLIFIER TOPOLOGIES EMPLOYING DC ISOLATION filed Nov. 17, 2003 the entire disclosure of which is incorporated herein by reference for all purposes.

BACKGROUND OF THE INVENTION

The present invention relates generally to overcurrent protection, and more specifically to providing overcurrent protection in amplifier topologies which employ DC isolation.

DC isolation is employed in many amplifier topologies to separate relatively high power output stages from the relatively low power circuits which drive them. It is desirable to provide such isolation for a variety of reason, e.g., to reduce fabrication costs, especially in cases where the lower power circuits may be characterized by more than one signal or power supply level. Overcurrent protection schemes which are compatible with such isolation techniques are also desirable.

SUMMARY OF THE INVENTION

According to the invention, compatible overcurrent protection and DC isolation techniques are provided. According to a specific embodiment, an amplifier having output switch circuitry is provided. A sense resistor is operable to transmit an output current associated with the output switch circuitry. Low-voltage circuitry is operable to provide a drive signal to the output switch circuitry. Isolation circuitry is operable to provide DC isolation between the low-voltage circuitry and the output switch circuitry. Current sensing circuitry is directly connected to the sense resistor and is operable to sense the output current in the sense resistor and generate a fault signal in response to an overcurrent condition. The fault signal is characterized by a signal level which is compatible with the low-voltage circuitry without additional DC isolation.

According to another embodiment, an amplifier is provided having an output switching stage, a low voltage stage operable to generate a drive signal for driving the output switching stage, and isolation circuitry operable to provide DC isolation between the low voltage stage and the output switching stage. Current sensing circuitry is operable to detect an overcurrent condition in the output switching stage and generate a fault signal. The fault signal is characterized by a signal level which is compatible with the low voltage stage without additional DC isolation.

A further understanding of the nature and advantages of the present invention may be realized by reference to the remaining portions of the specification and the drawings.

DETAILED DESCRIPTION OF SPECIFIC EMBODIMENTS

Reference will now be made in detail to specific embodiments of the invention including the best modes contemplated by the inventor for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the following description, specific details are set forth in order to provide a thorough understanding of the present invention. The present invention may be practiced without some or all of these specific details. In addition, well known features may not have been described in detail to avoid unnecessarily obscuring the invention.

As mentioned above, a variety of techniques may be employed in switching circuit topologies to provide isolation between relatively high power output devices and the relatively low power circuitry which drives them. Such techniques include capacitive and inductive coupling. Embodiments of the present invention provide overcurrent sensing techniques which may be employed in conjunction with such isolation techniques.

Figure 1:
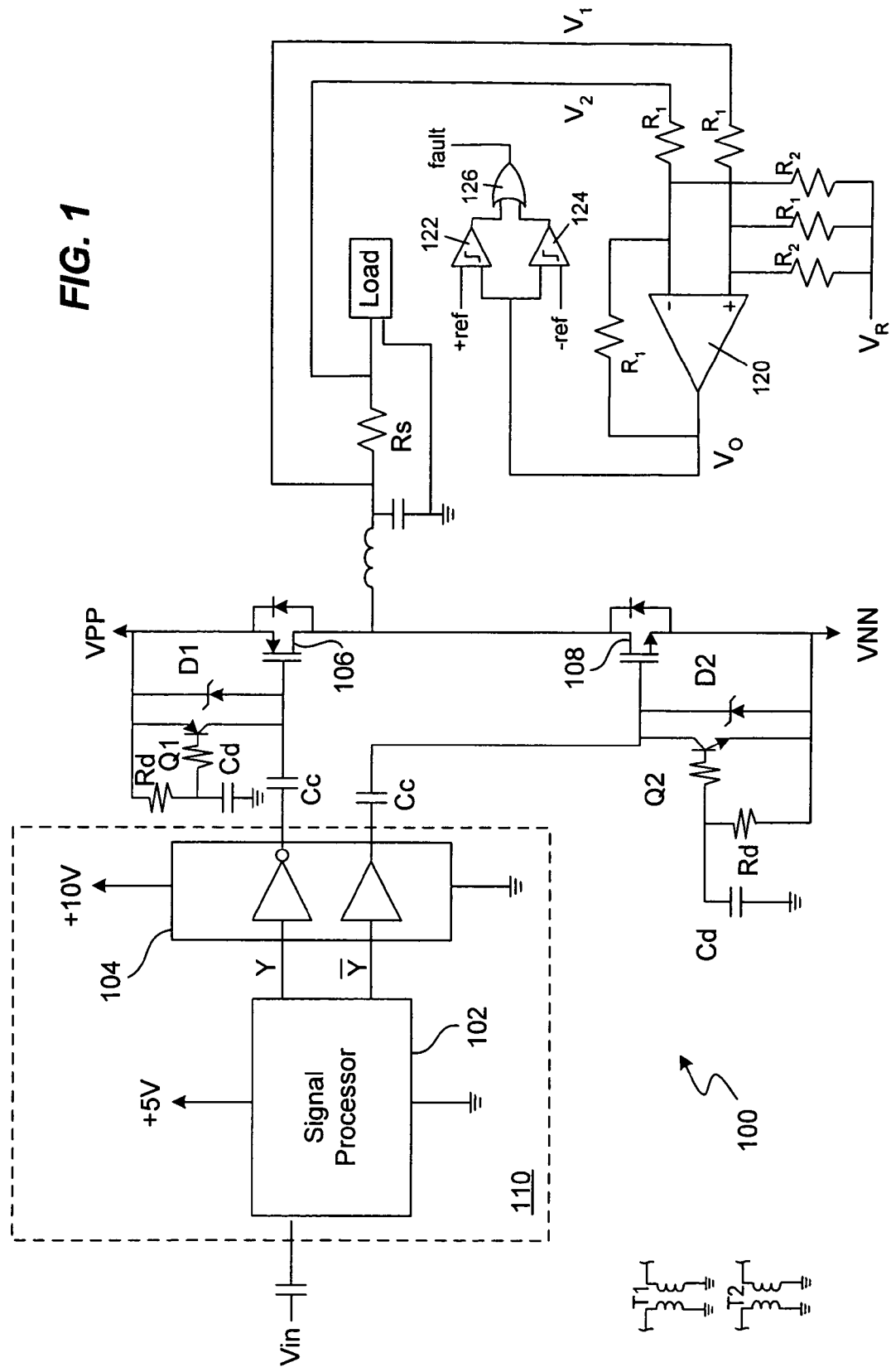
FIG. 1 is a schematic diagram illustrating a specific embodiment of the invention.

FIG. 1 illustrates an exemplary switching amplifier in which a particular embodiment of the invention may be implemented. It should be noted that the amplifier topology of FIG. 1 is shown and described to provide an example of a context in which the present invention may be practiced. However, the present invention is not limited to the described context and may be practiced in any of a wide variety of amplifier topologies in which DC isolation is provided.

Switching amplifier 100 includes a low voltage, noise-shaping signal processor 102 which generates complementary 1-bit digital signals Y and $\overline{Y}$. According to the embodiment shown, these 0~5V signals are level shifted by high current driver circuit 104 to 0~10V signals to provide the appropriate voltage and current levels to drive output FETs 106 and 108.

Two capacitors $C_C$ provide DC isolation between the output FETs and current driver circuit 104 and, along with diodes D1 and D2, level shift the output signals of circuit 104 to VPP ~VPP−10 volts at the gate of high side FET 106, and VNN ~VNN+10 volts at the gate of low side FET 108. Where the FET driving voltages are relatively low, e.g., the 10 volt range, diodes D1 and D2 may comprise signal diodes. Where the FET driving voltages are higher, e.g., the 15 volt range, zener diodes may be used to clamp the gates to ±10 volts.

Transistors Q1 and Q2 squelch the gates of output FETs 106 and 108 (in accordance with the time constant corresponding to Rd and Cd) during the time when supply voltages VPP and VNN are ramping up. That is, because of the RC time constants, the base terminals of transistors Q1 and Q2 lag behind the supply voltages keeping transistors Q1 and Q2 turned on, effectively clamping the gates of the output FETs to the supply voltages, thereby ensuring that the output FETs remain off until the supply voltages have stabilized and transistors Q1 and Q2 subsequently turn off. This eliminates potentially catastrophic results which might otherwise occur at turn on as a result of the indeterminate state of the gates of the output FETs.

Significant benefits may be derived from the DC isolation provided by capacitors Cc. For example, because driver circuit 104 is isolated from the high supply voltages (e.g., ±50V) required by the output FETs, it does not have the breakdown voltage requirements of a driver circuit directly coupled to the output switches. Thus, if driver circuit 104 is implemented as an integrated circuit, a lower voltage (and therefore less expensive) process may be employed in its fabrication.

In addition, the isolation of driver circuit 104 from the output FETs creates an opportunity to integrate driver circuit 104 with the low voltage circuitry of signal processor 102 in a single monolithic integrated circuit (represented by dashed line 110). Thus, for example, in the exemplary embodiment shown in FIG. 1, a 16~20V process with geometries around 0.5 uM could be used for such a monolithic IC instead of a 80~100V process (with the correspondingly larger geometries) for driver circuit 104, and a 5~10V process for processor 102. In general, lower voltage processes are less expensive and more common than their high voltage counterparts, allowing the designer to select from a greater variety of mature processes offered by a greater number of semiconductor fabs.

Overcurrent protection for amplifier 100 may be provided according to a specific embodiment of the invention using a current sensing circuit which senses the current flowing in sense resistor Rs (which might, for example, be in the range of 50–100 milliohms) and generates a fault signal in response to an overcurrent condition. Op amp 120 is configured with resistors $R_1$ and $R_2$ to generate an output $V_O$ equal to $V_1-V_2+V_R$. Exemplary values for $R_1$ and $R_2$ are 200 kΩ and 6 kΩ, respectively. $V_R$ may be selected to place the output of op amp 120 at the desired level halfway between the +ref and −ref voltages associated with comparators 122 and 124, e.g., if −ref is zero volts and +ref is 5 volts, $V_R$ may be set at 2.5 volts.

Figure 2:
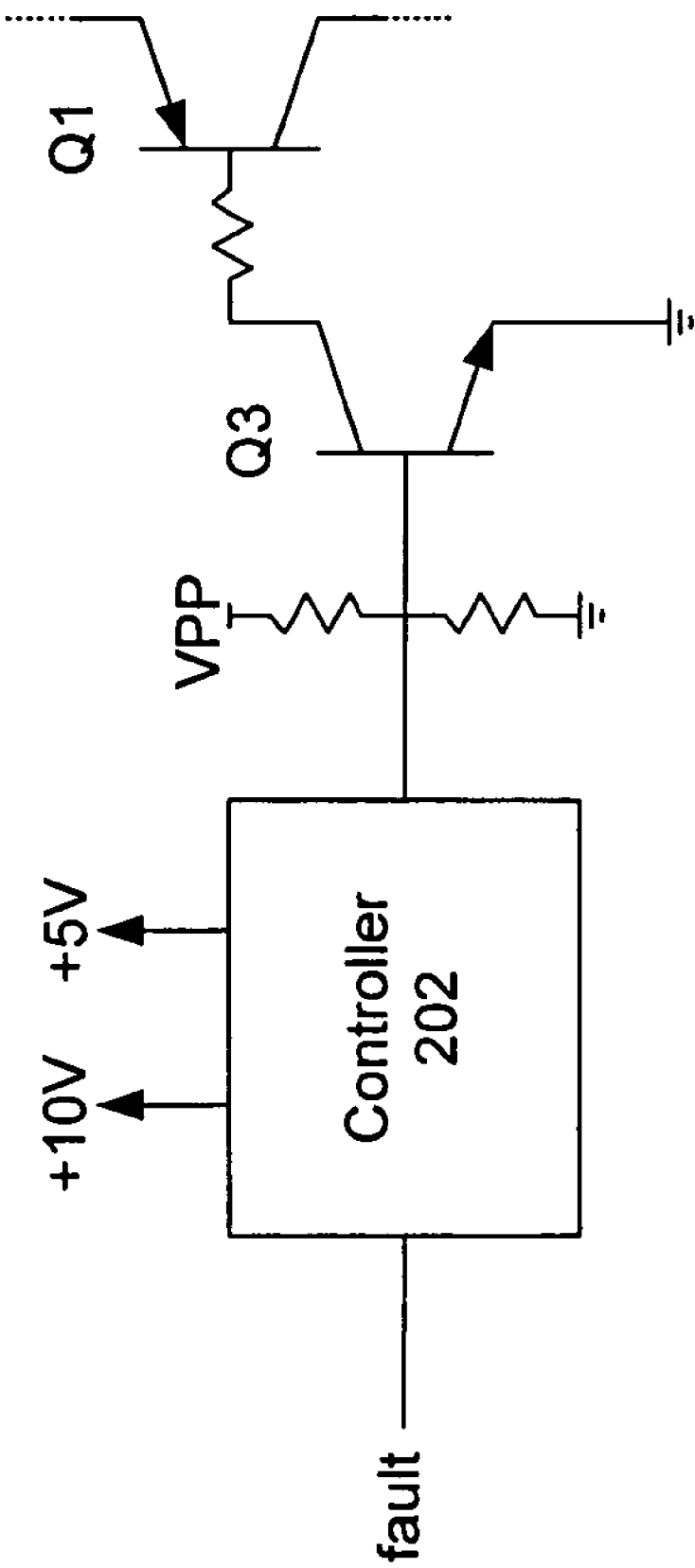
FIG. 2 is a schematic diagram of an alternative circuit for use with a specific embodiment of the invention.

If $V_O$ goes outside of the range between −ref and +ref (i.e., a large voltage appears across Rs), a fault signal is generated (e.g., at the output of OR gate 126) which may be used in any of a variety of ways to control or shut down operation of amplifier 100. For example, the signal may be used as an input to a "window" circuit, the output of which may be used to turn off the output switches. One exemplary use of the fault signal is described below with reference to FIG. 2. In view of the fact that the use of a fault indicator to control the operation of an amplifier is well within the knowledge of one of skill in the art, further details regarding the manner in which the fault signal generated according to the invention may be used are not provided here.

The voltage levels associated with most of the current sensing circuitry are significantly lower than the voltages experienced by the sensing resistor Rs. Thus, the current sensing circuitry and any circuitry employing the fault signal are effectively isolated from the high voltages of the output stage of amplifier 100. Much of this circuitry can therefore be implemented as relatively inexpensive, low voltage circuitry as described above with reference to signal processor 102 and driver circuitry 104. In fact, the current sensing circuitry (with the exception of the resistors connected directly to Rs) could be implemented on a single die with either or both of circuits 102 and 104.

While the invention has been particularly shown and described with reference to specific embodiments thereof, it will be understood by those skilled in the art that changes in the form and details of the disclosed embodiments may be made without departing from the spirit or scope of the invention. For example, the present invention relates generally to providing overcurrent protection in a switching amplifier topology which employs some form of DC isolation. The techniques described herein may be applied to any of a wide variety of switching circuit topologies such as, for example, any type of digital or class D amplifier including sigma delta modulators, and modified sigma delta modulators (e.g., Class T amplifiers available from Tripath Technology Inc. of Santa Clara, Calif.). Examples of suitable amplifier topologies are described in U.S. Pat. No. 5,777,512 for METHOD AND APPARATUS FOR OVERSAMPLED, NOISE-SHAPING, MIXED-SIGNAL PROCESSING issued Jul. 7, 1998, the entire disclosure of which is incorporated herein by reference for all purposes. However, it will be understood that the invention is not limited to the described topologies. For example, the present invention may also be applied to any type of pulse width modulation (PWM) amplifier, switch mode power supplies (SMPS), etc.

Moreover, the invention is not limited by the manner in which DC isolation is provided. That is, for example, the invention is not limited to topologies employing capacitive coupling. Other DC isolation techniques such as, for example, transformer or inductive coupling (e.g., transformers T1 and T2 of FIG. 1 in place of capacitors Cc), may be employed with various embodiments of the invention.

In addition, instead of controlling the bases of Q1 and Q2 with the RC circuits shown in FIG. 1, other types of control circuits may be employed which include, but are not limited to, active circuit elements which are enabled for a programmable period of time or in response to one or more control signals. For example, according to an alternative embodiment illustrated in FIG. 2, the base of Q1 is coupled to the collector of another transistor Q3 which is driven to pull the base of Q1 down for a period of time. The driving signal of such a transistor and the period of time could be controlled by any of a variety of analog or digital circuitry (represented by controller 202) including, for example, a microprocessor or any other type of controller. This circuitry may be incorporated or integrated with the driver circuitry or separate therefrom. Such a controller may be configured to operate during stabilization of the supply voltages (e.g., during power up). Such a controller may also be configured to control Q1 and Q2 during amplifier operation independent of drive from the driver circuitry, e.g., in response to a fault condition such as, for example, an overcurrent condition indicated by the fault signal generated by OR gate 126 of FIG. 1. In addition, and as will be understood, such a controller may be configured to drive transistors Q1 and Q2 directly.

Finally, although various advantages, aspects, and objects of the present invention have been discussed herein with reference to various embodiments, it will be understood that the scope of the invention should not be limited by reference to such advantages, aspects, and objects. Rather, the scope of the invention should be determined with reference to the appended claims.

What is claimed is:

1. An amplifier, comprising:
   output switch circuitry comprising complementary field effect transistors;
   a sense resistor operable to transmit an output current associated with the output switch circuitry;
   low-voltage circuitry operable to provide a drive signal to the output switch circuitry;
   isolation circuitry operable to provide DC isolation between the low-voltage circuitry and the output switch circuitry;

current sensing circuitry directly connected to the sense resistor and operable to sense the output current in the sense resistor and generate a fault signal in response to an overcurrent condition, the fault signal being characterized by a signal level which is compatible with the low-voltage circuitry without additional DC isolation; and transient control circuitry operable to keep the field effect transistors off during stabilization of supply voltages associated with the field effect transistors.

2. The amplifier of claim 1 wherein the isolation circuitry comprises one of a capacitor and a transfonner.

3. The amplifier of claim 1 wherein the low-voltage circuitry comprises first circuitry operable to generate complementary signals, and second circuitry operable to level shift the complementary signals to signal levels appropriate for driving the output switch circuitry.

4. The amplifier of claim 3 wherein the first and second circuitry are integrated on a single chip.

5. The amplifier of claim 4 wherein the current sensing circuitry is also integrated on the single chip.

6. The amplifier of claim 1 wherein the transient control circuitry comprises clamping circuits operable to clamp drive terminals of a corresponding one of the field effect transistors to the associated supply voltage for a predetermined period of time.

7. The amplifier of claim 6 wherein each clamping circuit comprises a clamping switch coupled between the corresponding supply voltage and drive terminal.

8. The amplifier of claim 7 wherein the each clamping circuit further comprises an RC circuit coupled to the corresponding supply voltage which is operable to supply a gating signal to the clamping switch which lags behind the corresponding supply voltage.

9. A The amplifier of claim 8 wherein each clamping circuit further comprises a second clamping switch which is operable to provide a gating signal to the clamping switch.

10. The amplifier of claim 9 wherein each clamping circuit further comprises a controller circuit which is operable to drive the second clamping switch.

11. The amplifier of claim 10 wherein the controller circuit is operable to drive the second clamping switch in response to the fault signal.

12. The amplifier of claim 10 wherein the controller circuit is operable to drive the second clamping switch during stabilization of the supply voltage.

13. The amplifier of claim 1 wherein the current sensing circuitry is operable to convert a first sense voltage across the sense resistor to a second sense voltage for comparison to upper and lower threshold voltages, the fault signal being generated when the second sense voltage does not fall between the upper and lower threshold voltages.

14. The amplifier of claim 1 wherein the amplifier comprises one of a digital amplifier, a pulse width modulator, and a switch mode power supply.

15. The amplifier of claim 14 wherein the digital amplifier comprises one of a sigma-delta modulator and a modified sigma-delta modulator.

* * * * *